United States Patent [19]
Einset

[11] Patent Number: 5,445,106
[45] Date of Patent: Aug. 29, 1995

[54] METHOD FOR MAKING HIGH THERMAL CONDUCTING DIAMOND

[75] Inventor: Erik O. Einset, Niskayuna, N.Y.

[73] Assignee: General Electric Company, Schenectady, N.Y.

[21] Appl. No.: 316,995

[22] Filed: Oct. 3, 1994

[51] Int. Cl.⁶ .............................................. C30B 25/02
[52] U.S. Cl. ......................................... 117/1; 117/89; 423/416
[58] Field of Search ................... 117/1, 44, 79, 88, 89; 118/723 HC; 423/446; 427/585; 437/946, 966

[56] References Cited

U.S. PATENT DOCUMENTS

| | | | |
|---|---|---|---|
| 5,114,696 | 5/1992 | Purdes | 423/446 |
| 5,273,731 | 12/1993 | Anthony et al. | 423/446 |
| 5,310,596 | 5/1994 | Bigelow et al. | 428/212 |
| 5,346,729 | 9/1994 | Pitts et al. | 427/585 |

FOREIGN PATENT DOCUMENTS 2140918A  5/1990  Japan ..................... 117/88

OTHER PUBLICATIONS

"Isotherms in Diamond Heat Sinks, Non-Linear Heat Transfer in an Excellent Heat Conductor", J. Doting, et al., IEEE, 1988, pp. 113–117.

"Temperature Distribution in GaAs Lasers with Diamond Film Heatsink", GK Reeves, et al., Electronics Letters, Dec. 3, 1992, vol. 28, No. 25, pp. 2317–2318.

"Thermal and Optical Applications of Thin Film Diamond", M. Seal, Phil. Trans. R. Soc. London, 1993, pp. 119–128.

Primary Examiner—R. Bruce Breneman
Assistant Examiner—Felisa Garrett
Attorney, Agent, or Firm—Noreen C. Johnson; James Magee, Jr.

[57] ABSTRACT

A method is disclosed for producing continuous CVD diamond films with at least two controlled diamond thermal conductivity layers having improved thermal conductivity in the direction parallel to the diamond film plane to increasing the lateral heat spreading ability of the diamond film. Also, disclosed is a method to decrease the time to deposit high thermal conducting diamond by chemical vapor deposition.

7 Claims, 2 Drawing Sheets

METHOD FOR MAKING HIGH THERMAL CONDUCTING DIAMOND

This application is related to the following copending application which is commonly assigned and is incorporated herein by reference: E.O. Einset, "Diamond Film Structure with High Thermal Conductivity," U.S. application Ser. No. 08/316,498 (attorney docket number RD-23,948).

FIELD OF THE INVENTION

This invention relates to a method for making high thermal conducting diamond, and more particularly, to a method for continuous diamond films with improved overall thermal conductivity in the directions perpendicular to and parallel to the film plane.

BACKGROUND OF THE INVENTION

As a result of the tightly packed atoms and strong bonds of the diamond lattice, diamond is the best conductor of heat known at ambient temperatures. For instance, natural diamond conducts heat about five times better than copper at 300 Kelvin (K) with a conductivity about 2000 Watts per meter Kelvin (W/m K). Of the many uses of diamond where its high thermal conductivity plays a role, the use as a "heat sink", is probably the one which depends most directly on this property.

In electronic applications, the density of integrated circuits is limited by the large amount of heat generated by the extremely close packing of the electronic components on the chip, very high frequencies, and power density levels. To remove this heat, it is necessary to use hybrid circuits and bulky heat-dissipation devices or complicated and expensive refrigeration. New heat-sink materials are necessary.

Likewise, the production of laser diodes has led to extremely high intensity of light output, an output that is further augmented when the diodes are placed in arrays. Again, the limiting factor in the performance of the devices is the ability to dissipate the heat in the package.

The above problems can be solved by using diamond formed by chemical Vapor deposition, herein sometimes called CVD diamond. However, presently the thermal conductivity of CVD diamond differs from that of natural diamond in that it may vary through the thickness of a sample and is anisotropic. As discussed by M. Seal in the article, *Thermal and Optical Applications of Thin Film Diamond*, PHIL. TRANS R. SOC. LOND A (1993) pages 313-322, polycrystalline CVD diamond films show an anisotropy of thermal conductivity between directions parallel to (lateral) and perpendicular to the film plane. The thermal conductivity measured perpendicular to the plane was found to be at least 50% higher than that parallel to the plane. The conductivity has been found to vary inversely with the growth rate and Raman line width. Since the diamond layers are heat spreaders, it is the parallel or lateral conductivity which is limiting.

Thus, it would be desirable to provide a method to make synthetic diamond with high parallel and perpendicular thermal conductivity by CVD processes so that the overall conductivity is improved. It would also be desirable to produce CVD diamond with high thermal conductivity in shortened time periods.

SUMMARY OF THE INVENTION

The present invention is directed to methods for producing CVD polycrystalline diamond films with improved overall thermal conductivity by increasing the lateral heat spreading ability of diamond in a controlled thermal conductivity layer. By "controlled thermal conductivity layer" is meant a layer of CVD diamond deposited under controlled parameters, such as growth rate and substrate temperature, in order to achieve a specified thermal conductivity in the diamond layer.

The overall thermal conductivity of the diamond film is increased by depositing at least two controlled thermal conductivity layers. A first layer is deposited at a high growth rate and corresponding substrate temperature and has high thermal conductivity in the direction perpendicular to the diamond film plane. A second layer is deposited on the first layer, without interrupting the columnar structure of the diamond film, at a lower growth rate and substrate temperature than the first layer and has high thermal conductivity in the directions parallel and perpendicular to the diamond film plane.

There is provided by the present invention a method for forming a continuous polycrystalline diamond film having at least two controlled thermal conductivity layers, said method comprising: depositing by chemical vapor deposition at a high growth rate on a substrate maintained at a temperature that promotes said high growth rate, a first controlled thermal conductivity layer having a continuous columnar structure of diamond crystals, where said first layer has high thermal conductivity in a direction perpendicular to a diamond film plane; and continuing to deposit by chemical vapor deposition, without interrupting the columnar structure of said diamond crystals, a second controlled thermal conductivity layer on top of the first layer at a growth rate less than the high growth rate, said substrate now maintained at a temperature lower than the substrate temperature used for the first layer, where said second layer has high thermal conductivity in directions perpendicular and parallel to the diamond film plane.

The present invention is also directed to a method to decrease the time to grow a continuous diamond film by hot filament chemical vapor deposition while increasing said film's thermal conductivity, said method comprising: growing a first diamond layer at a growth rate of at least about one micron per hour on a substrate at about 850°–1000° C. until said first layer is up to about fifty times as thick as a second diamond layer; and then continuing to grow without interruption the second diamond layer on top of said first layer at a growth rate less than one micron per hour, said substrate being about 700°–850° C., where said continuous diamond film has high thermal conductivity in the direction parallel to the film plane in said second layer and high thermal conductivity throughout the diamond film in a direction perpendicular to the film plane.

In the above methods of the invention the continuous diamond film may be deposited in a cycle that sequentially repeats first and second layers. The term "diamond film" may mean an article of any shape and thickness that is deposited by a chemical vapor deposition process for diamond. The term "diamond film plane" means the same plane as the surface of the substrate that the diamond is deposited on during chemical vapor deposition.

The present invention is applicable to any known process for the chemical vapor depostion of diamond on a substrate. Such chemical vapor deposition processes include, but are not limited to, hot filament (HFCVD), microwave plasma assisted, plasma torch, and direct current arc plasma. The detailed description of the invention referring to one type of chemical vapor deposition process which follows is representative of the practice of the present invention using other types of conventional CVD processes.

BRIEF DESCRIPTION OF THE DRAWINGS

FIG. 2 shows a temperature profile for a corner of the CVD diamond film in FIG. 1a.

DETAILED DESCRIPTION OF THE INVENTION

Figure 1:
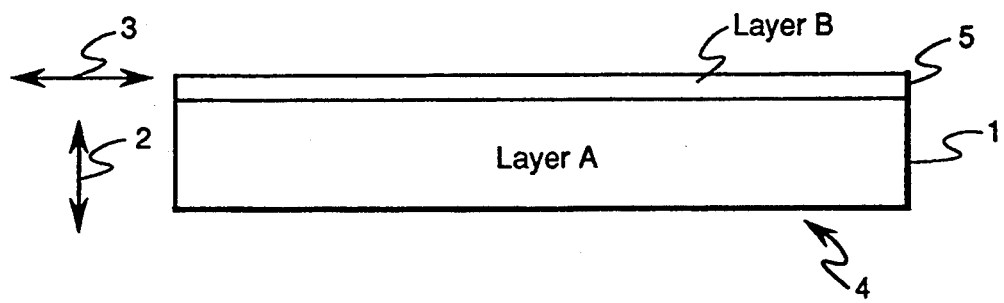
FIGS. 1 and 1a show the continuous diamond film having at least two thermal conductivity layers. Layer A is grown at a higher growth rate than layer B.

One type of diamond depositon process that can be used in the practice of this invention is hot filament chemical vapor deposition, sometimes called HFCVD. The process is contemplated for use, and is described merely to impart an understanding of the present invention.

Briefly, the HFCVD process takes place in an enclosed apparatus in a reaction chamber which is airtight, capable of being maintained at reduced pressure, and is fitted with a suitable gas inlet and an exhaust port. All portions of the apparatus which are present in the reaction chamber are constructed of suitable heat-resistant materials, as necessary to withstand filament temperatures on the order of about 2000° C. and substrate temperatures up to about 1000° C. Quartz is an illustrative non-conductive heat-resistant material suitable for this purpose.

Features of the apparatus include a substrate, generally molybdenum or other suitable material, which may have a planar or curved diamond deposition surface, but is not limited to such. The substrate is maintained in position at a suitable spacing from a resistance heating means for deposition to take place.

The resistance heating means comprise two electrodes and a one or more vertically extending linear, electrically conductive filaments or wires, herein called filaments, and otherwise being of conventional design and circuitry. The material of which said filaments are comprised is not critical, any material known in the art as suitable for this purpose being acceptable. Illustrative materials are metallic tungsten, tantalum, molybdenum, and rhenium. Filament diameters of about 0.2–1.0 mm. are typical. The filaments are located parallel to the substrate. Distances from filaments to substrate are generally on the order of 5–10 mm.

It is highly desirable to maintain substrates at temperatures in the range of about 700°–1000° C., with a range of about 850°–1000° C. for high growth rate layers and a range of about 700°–850° C. for low growth rate layers. The desired temperature control is achieved by a substrate cooling means comprising a heat sink. The substrate is positioned between the heat sink and the filament. The heat sink is typically made of metallic copper and cooled by attached serpentine tubing fitted with a cooling water inlet and outlet respectively. The substrate temperature is kept by auxiliary heaters, by hot filament power, or by a heating means as disclosed in copending and commonly assigned U.S. patent application, Ser. No. 08/172,797, filed Dec. 27, 1993.

In operation, the reaction chamber of the apparatus is maintained at a pressure up to about 760 torr, typically on the order of 10 torr. A mixture of hydrogen and a hydrocarbon, most often methane and generally present in an amount up to about 2% by volume based on total gas, is passed into the chamber and a current is passed through the electrodes and filaments to heat the filaments to a temperature of at least about 2000° C.

The substrate temperature is kept in the range of about 700°–1000° C., preferably at about 850°–1000° C. for the first layer of diamond deposited at a high growth rate and at about 750°–850° C. for the second layer of diamond deposited at a low growth rate, and most preferably at about 900°–960° C. for high growth rate deposition of diamond and about 800° C. for the low growth rate deposition of diamond.

In the practice of this invention the thickness of the layers is determined by the application for the diamond film. The first layer is up to about fifty times as thick as the second layer, or the second layer is up to about 20 percent as thick as the first layer. For instance, if the diamond film is to be used as a heat sink, the total thickness might be 0.50 millimeters, with the first layer being thickest (0.40–0.50 mm) and the second layer being the thin layer (0.01–0.10 mm).

The overall time to grow the diamond film is dependent on the growth rate chosen for each layer and the total desired thickness of the diamond film. The first layer is deposited at a high growth rate for the CVD process utilized. For instance, for HFCVD a high growth rate is generally at least one micron per hour. The second layer is deposited at a low growth rate, determined by the CVD process used. The result is high thermal conductivity, generally at least 1000 W/m K, in the direction parallel to the film plane in the thin, second layer. This layer is also the top layer of the diamond film and therefore, serves to dissipate and spread laterally the heat generated at its top surface.

EXAMPLE

To demonstrate the present invention, referring to FIG. 1, there is shown a schematic diagram of a layered thermal conductivity continuous diamond film. Layer A 1 is grown at a high growth rate, about one micron per hour for hot filament CVD and about 3–5 microns per hour for microwave plasma CVD. Layer A's thermal conductivity in the direction parallel 3 to the film plane 4 is low, about 300 W/m K. However, Layer A 1 has a high thermal conductivity in the direction perpendicular 2 to the film plane 4, about 1000 W/m K. Layer B 5 is grown at a low growth rate, about less than one micron per hour for hot filament CVD and 1.0–2.0 microns per hour for microwave plasma CVD. Layer B 5 has high thermal conductivity in the direction parallel 3 to the film plane 4.

Figure 1A:
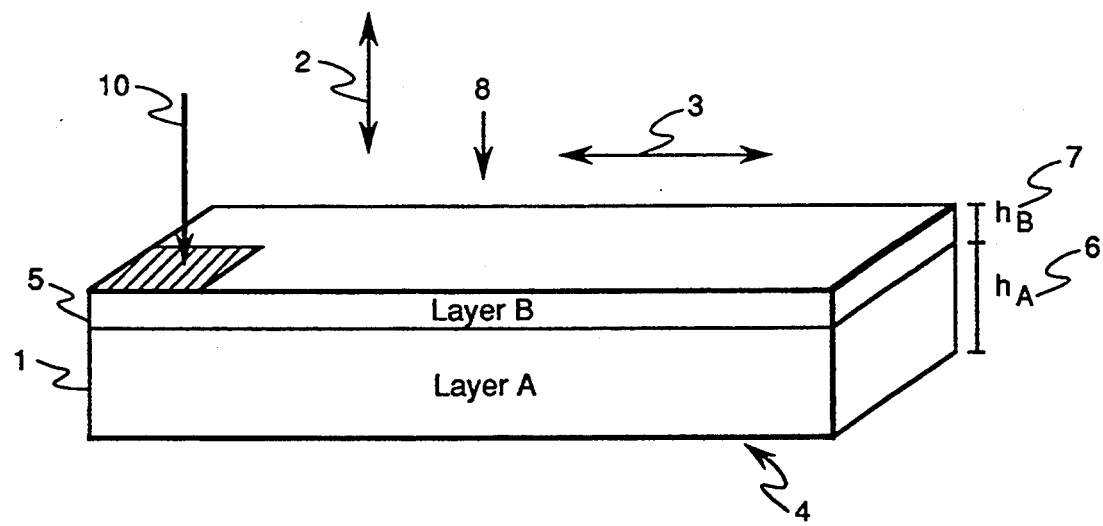

FIG. 1a shows a pictorial of a solid diamond plate consisting of two controlled thermal conductivity diamond layers, Layer A 1 and Layer B 5. Layer A 1 with thickness $h_A$ 6 has thermal conductivity in the parallel direction 3 to the film plane 4 of 300 W/m K and a thermal conductivity in the perpendicular direction 2 of 1000 W/m K. Layer B 5 with thickness $h_B$ 7 has parallel and perpendicular thermal conductivities of about 1000 W/m K. For hot filament CVD, Layer A 1 is grown at one micron per hour and Layer B 5 is grown at 0.3 microns per hour. The total time to deposit 0.50 millimeters(mm) of diamond film is shown in Table 1 for various layer thicknesses. Table 1 also gives peak temperatures at the top surface 8 of Layer B 5 during operation of the diamond film as a heat sink. By varying the thicknesses of Layers A 1 and B 5, it is shown that a significant savings in growth time can be obtained

TABLE 1

Calculated Peak Temperatures at Top Surface of Layer B and Total Growth Times for Continuous Diamond Film by HFCVD.

| Layer A $h_A(1\mu/hr)$ | Layer B $h_B(0.3\mu/hr)$ | Peak Temperature °C. | Growth Time Days |
|---|---|---|---|
| 0.00 mm | 0.50 mm | 69.9° C. | 69.4 |
| 0.48 mm | 0.02 mm | 87.2° C. | 22.8 |
| 0.45 mm | 0.05 mm | 78.6° C. | 23.6 |
| 0.40 mm | 0.10 mm | 73.5° C. | 30.5 |

Figure 2:
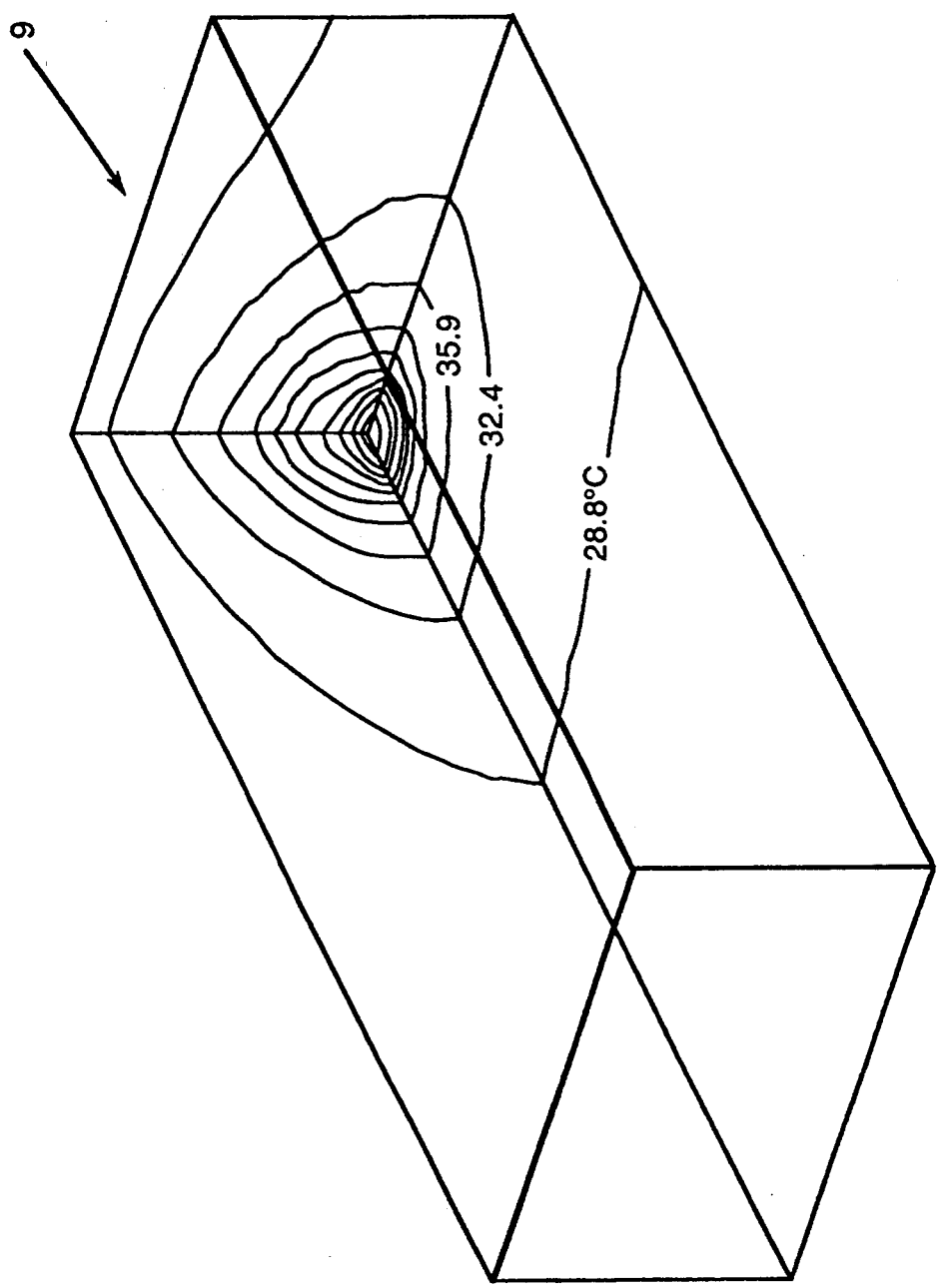

Now referring to FIG. 2, there is represented a temperature profile 9 of a plotted isotherm for $h_A$ 6 (FIG. 1a) equals 0.40 mm and $h_B$ 7 (FIG. 1a) equals 0.10 mm on the far wall of CVD diamond. The diamond film measures 2.0 mm long, 0.8 mm wide, and 0.5 mm thick. A heat flux of 4.2 Watts impinges over an area of 0.1 mm by 0.1 mm in the corner of the diamond 10 (see FIG. 1a). It is demonstrated that the temperature rise in the diamond is 46.5° C. The base of the diamond is maintained at a constant temperature of 27° C. and the peak temperature is 73.5° C.

What is claimed:

1. A method for forming a continuous diamond film having at least two controlled thermal conductivity layers, said method comprising:
    (a) depositing by chemical vapor deposition at a first growth rate on a substrate maintained at a temperature that promotes said first growth rate, a first controlled thermal conductivity layer having a continuous columnar structure of diamond crystals, where said first layer has high thermal conductivity in a direction perpendicular to a diamond film plane; and
    (b) continuing to deposit by chemical vapor deposition, without interrupting the columnar structure of said diamond crystals, a second controlled thermal conductivity layer on top of the first layer at a growth rate less than the first growth rate, said substrate now maintained at a temperature lower than the substrate temperature used for the first layer, where said second layer has high thermal conductivity in directions perpendicular and parallel to the diamond film plane.

2. A method according to claim 1 where the chemical vapor deposition is hot filament chemical vapor deposition.

3. A method according to claim 2 where the first growth rate of the first layer is at least about one micron per hour and the substrate temperature for the first growth rate is between about 850°–1000° C.

4. A method according to claim 2 where the low growth rate of the second layer is less than one micron per hour and the substrate temperature for the low growth rate is between about 700°–850° C.

5. A method according to claim 2 where said second layer is about up to 20 percent as thick as the first layer.

6. A method according to claim 2 where said substrate is molybdenum.

7. A method according to claim 1 where said continuous diamond film is deposited in a cycle that sequentially repeats steps (a) and (b).

* * * * *